United States Patent
Lin et al.

(10) Patent No.: US 9,964,866 B2
(45) Date of Patent: May 8, 2018

(54) METHOD OF FORMING INTEGRATED CIRCUIT

(71) Applicant: UNITED MICROELECTRONICS CORP., Hsin-Chu (TW)

(72) Inventors: Che-Yi Lin, Kaohsiung (TW);
En-Chiuan Liou, Tainan (TW);
Chia-Hsun Tseng, Tainan (TW);
Yi-Ting Chen, Kaohsiung (TW);
Chia-Hung Wang, Taichung (TW);
Yi-Jing Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 142 days.

(21) Appl. No.: 15/065,872

(22) Filed: Mar. 10, 2016

(65) Prior Publication Data
US 2017/0220728 A1 Aug. 3, 2017

(30) Foreign Application Priority Data
Feb. 2, 2016 (TW) .............................. 105103233 A

(51) Int. Cl.
*G06F 17/50* (2006.01)
*G03F 9/00* (2006.01)

(52) U.S. Cl.
CPC ................. *G03F 9/7003* (2013.01)

(58) Field of Classification Search
CPC .................................................. G06F 17/5081
USPC .......................................................... 716/53
See application file for complete search history.

(56) References Cited

U.S. PATENT DOCUMENTS

| | | | |
|---|---|---|---|
| 8,976,355 B2 | 3/2015 | Van Der Sanden | |
| 2009/0186286 A1* | 7/2009 | Ausschnitt | G03F 7/70633 430/30 |
| 2010/0123886 A1 | 5/2010 | Bijnen | |

* cited by examiner

*Primary Examiner* — Suchin Parihar
(74) *Attorney, Agent, or Firm* — Winston Hsu

(57) ABSTRACT

A method of forming an integrated circuit includes the following steps. A substrate including a plurality of exposure fields is provided, and each of the exposure field includes a target portion and a set of alignment marks. Measure the set of alignment marks of each exposure field by a measuring system to obtain alignment data for the respective exposure field. Determine an exposure parameter corresponding to each exposure field and an exposure location on the target portion from the alignment data for the respective exposure field by a calculating system. Feedback the alignment data to a next substrate.

20 Claims, 5 Drawing Sheets

METHOD OF FORMING INTEGRATED CIRCUIT

BACKGROUND OF THE INVENTION

1. Field of the Invention

The present invention relates generally to a method of forming an integrated circuit, and more specifically to a method of forming an integrated circuit measuring at least a set of alignment marks of each exposure field of a substrate for immediate correction.

2. Description of the Prior Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle may be used to generate a circuit pattern to be formed on an individual layer of the IC. This pattern can be transferred onto a target portion. Transferring of the pattern is typically via imaging onto a layer of radiation-sensitive material (resist) provided on the substrate. In general, a single substrate will contain a network or adjacent target portions that are successively patterned with a lithographic apparatus, in which each target portion is irradiated by scanning the pattern through a radiation beam in a given direction.

As the development of miniaturization of integrated circuits progresses, it becomes a critical challenge to forma desired pattern as well as forming it on a specific position by a lithography process. Consequently, modern lithography apparatuses involve extensive measurement prior to the step of actually exposing or otherwise patterning the substrate at a target location. These operations, being time-consuming, limit the throughput of the lithography apparatus, and consequently increase the unit cost of the semiconductor or other products, specifically as pattern features become smaller and overlay performance requirements become ever more demanding. Therefore, an improved measuring method being time-saving, accurate measuring, simulating and correcting of patterns actually printed on a substrate including deformation of patterns printed on the substrate is urged in current industry.

SUMMARY OF THE INVENTION

The present invention provides a method of forming an integrated circuit, which sets at least a set of alignment marks for each exposure field, thereby pattern deviation such as pattern deformation and accurate pattern locations on a substrate can be calculated for exposure according to the locations and relative relations of these alignment marks included in the set of alignment marks.

The present invention provides a method of forming an integrated circuit including the following steps. A substrate including a plurality of exposure fields is provided, and each of the exposure fields includes a target portion and a set of alignment marks. The set of alignment marks of each exposure field is measured to obtain alignment data for the respective exposure field by a measuring system. An exposure parameter corresponding to each exposure field and an exposure location on the target portion is determined from the alignment data for the respective exposure field by a calculating system. The alignment data is fed back to a next substrate.

The present invention provides a method of forming an integrated circuit including the following steps. A substrate including a plurality of exposure fields is provided, and each of the exposure field includes a first target portion and a first set of alignment marks at a first layer, and a second target portion and a second set of alignment marks at a second layer. The first set of alignment marks of each exposure field is measured to obtain first alignment data and the second set of alignment marks of each exposure field is measured to obtain second alignment data, for the respective exposure field by a measuring system. An exposure parameter of each exposure field and an exposure location on the substrate are determined from the first alignment data and the second alignment data, for the respective exposure field by a calculating system.

According to the above, the present invention provides a method of forming an integrated circuit, which includes: measuring a set of alignment marks of each exposure field on a substrate to obtain alignment data for the respective exposure field by a measuring system; determining an exposure parameter and an exposure location corresponding to each exposure field from the alignment data for the respective exposure field by a calculating system; and forming a target pattern on each exposure field of the substrate by exposure. After exposure, the overlapping relation of the target pattern and patterns previously printed on the substrate may be measured to obtain overlapping data, and the overlapping data can be analyzed. Thereafter, an advanced process control (APC) may be carried out to feed back the alignment data or the overlapping data to later processes. This is a measuring way for a target pattern on one single layer. The present invention also provides a measuring way for a target pattern on multilayers, which includes: measuring a first set of alignment marks of each exposure field in a first layer to obtain first alignment data and measuring a second set of alignment marks of each exposure field in a second layer to obtain second alignment data for the respective exposure field by a measuring system; determining an exposure parameter of each exposure field and an exposure location on the substrate from the first alignment data and the second alignment data for the respective exposure field by a calculating system; forming a target pattern on each exposure field of the substrate by exposure. After exposure, the overlapping relation of the target pattern corresponding to a first target portion in the first layer and the overlapping relation of the target pattern corresponding to a second target portion in the second layer may be measured to obtain first overlapping data and second overlapping data, and the first overlapping data and the second overlapping data can be analyzed. Thereafter, an advanced process control (APC) may be carried out according to the first alignment data and the second alignment data or/and the first overlapping data and the second overlapping data in later processes.

These and other objectives of the present invention will no doubt become obvious to those of ordinary skill in the art after reading the following detailed description of the preferred embodiment that is illustrated in the various figures and drawings.

DETAILED DESCRIPTION

The present invention applies an improved measuring method to form an integrated circuit, wherein the improved measuring method adjusting exposure parameters such as exposure amounts, exposure angles, etc. by individual locations and their relative relations of a plurality of alignment marks on a substrate, thereby obtaining target patterns desired to be formed on the substrate. Two embodiments of the improved measuring method are presented.

Figure 1:
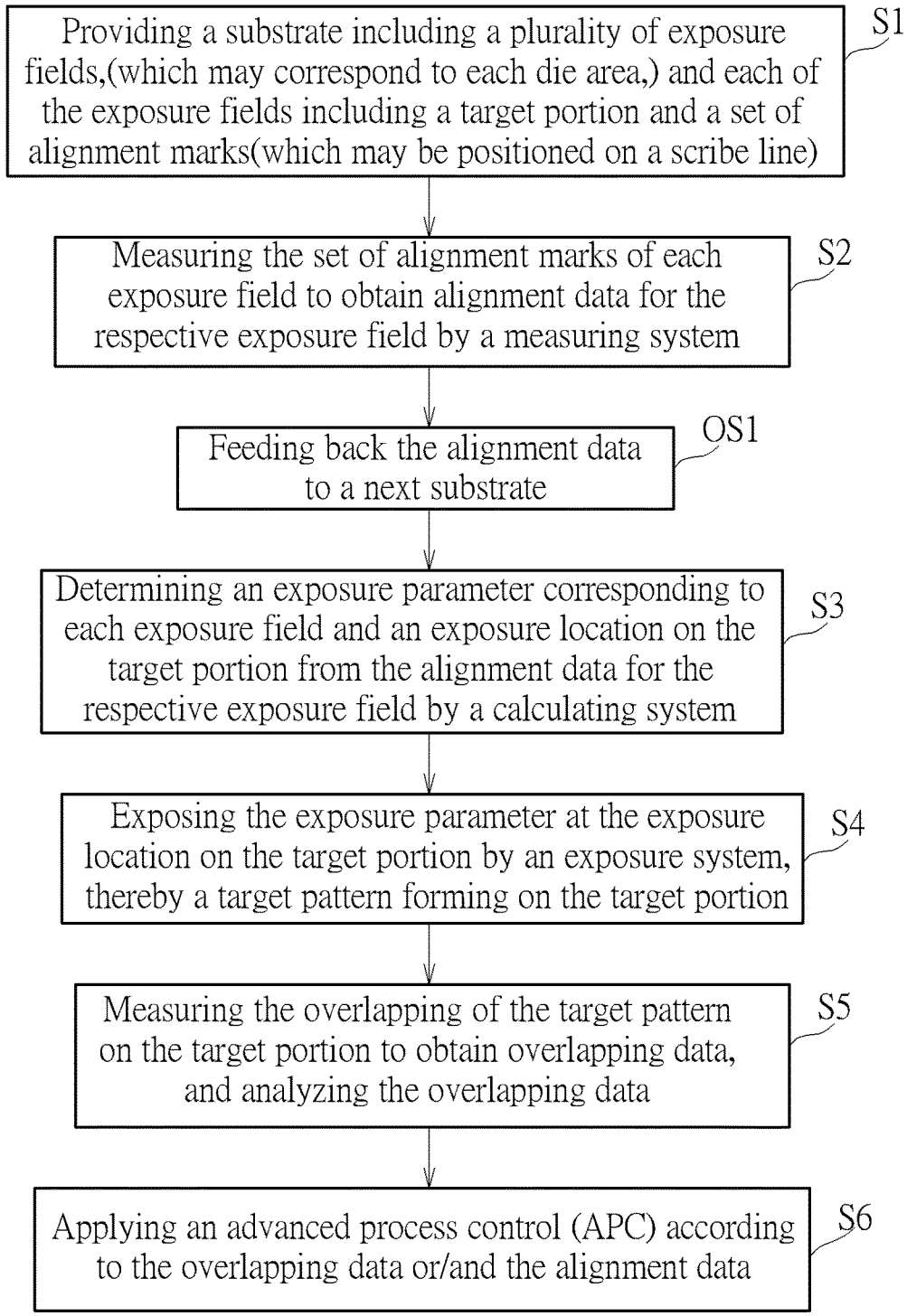
FIG. 1 schematically depicts a flowchart of a method of forming an integrated circuit according to an embodiment of the present invention.
Figure 2:
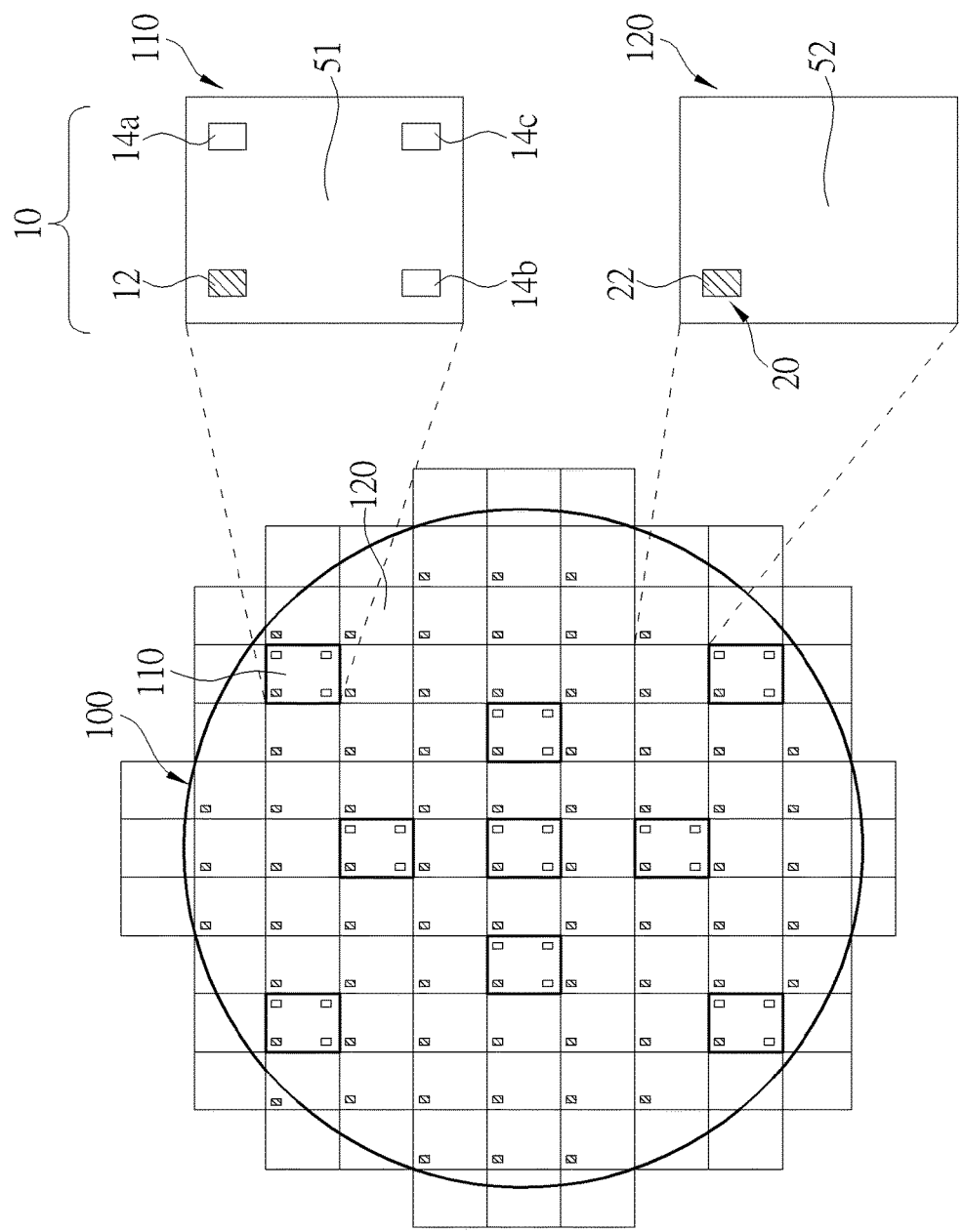
FIG. 2 schematically depicts a top view of a set of alignment marks on each exposure field of a substrate according to an embodiment of the present invention.

FIG. 1 schematically depicts a flow chart of a method of forming an integrated circuit according to an embodiment of the present invention. FIG. 2 schematically depicts a top view of a set of alignment marks on each exposure field of a substrate according to an embodiment of the present invention.

Refer to step S1 of FIG. 1: providing a substrate including a plurality of exposure fields, (which may correspond to each die area) and each of the exposure fields including a target portion and a set of alignment marks (which may be positioned on a scribe line). As shown in FIG. 2, a substrate 100 may include a plurality of exposure fields 110/120, wherein the exposure fields 110 and the exposure fields 120 may have different numbers of alignment marks. In this embodiment, each of the exposure fields 110 may include a set of alignment marks 10 and a target portion 51, wherein the set of alignment marks 10 may have a main alignment mark 12 and three additional alignment marks 14a/14b/14c respectively located in four corners of the exposure field 110; each of the exposure fields 120 may include a set of alignment marks 20 and a target portion 52, wherein the set of alignment marks 20 may only have a main alignment mark 22, but it is not limited thereto. In other embodiments, the number and the distribution of the set of alignment marks 10 in the exposure field 110 and the set of alignment marks 20 in the exposure field 120 are not restricted thereto. In this embodiment, deformations, rotations, shiftings or so on of each of the exposure fields 110 can be obtained by the alignment positions of the main alignment mark 12 and the additional alignment marks 14a/14b/14c, and relative relations of the main alignment mark 12 and the additional alignment marks 14a/14b/14c such as relative positions, relative distances, relative angles or so on of the main alignment mark 12 and the additional alignment marks 14a/14b/14c. Furthermore, the additional alignment marks 14a/14b/14c are only in the exposure fields 110 of the substrate 110 in this embodiment, thus only the exposure fields 110 in specific/selected positions are analyzed with multi-points. Hence, this reduces operation time and increases processing efficiency. In a preferred embodiment, the exposure fields 110 are distributed symmetric from a center point, but it is not limited thereto.

Refer to step S2 of FIG. 1: measuring the set of alignment marks of each exposure field to obtain alignment data for the respective exposure field by a measuring system. The set of alignment marks 10/20 of each exposure field 110/120 is measured by a measuring system to obtain alignment data.

The alignment data can show the alignment of each points of the substrate 100 corresponding to the absolute positions of the alignment marks of the set of alignment marks 10/20. It is emphasized that deformations, rotations, shiftings or so on in each of the exposure fields 110 can be obtained by the relative parameters of the main alignment mark 12 and the additional alignment marks 14a/14b/14c such as relative positions, relative distances, relative angles or so on of the main alignment mark 12 and the additional alignment marks 14a/14b/14c. Hence, not only point alignment, but also deformations, rotations, shiftings or so on in each of the exposure fields 110 can be obtained and corrected. Thus, exposure parameters corresponding to current or latter exposure fields can be adjusted according to alignment data, and integrated circuits can thus be formed accurately, with low cost and quickly.

Refer to step OS1 of FIG. 1: feeding back the alignment data to a next substrate. The alignment data may be optionally fed back to a next substrate. Thereby, the next substrate or a set of common substrates can be exposed directly according to the alignment data after being positioned during photolithography. In addition, the alignment data may be a reference data for the photolithography of the next substrate or a set of common substrates to make processes precise and with low cost. A method of feeding back the alignment data to a next substrate may include: determining an exposure parameter and an exposure location of each exposure field of the next substrate from the alignment data by a calculating system. In another embodiment, the method of feeding back the alignment data to a next substrate may include: re-calculating the alignment data and an alignment data of the next substrate to process an exposure of the next substrate, wherein the alignment data and the alignment data of the next substrate may have different weightings. The step OS1 may be processed in other (later) steps instead. The alignment data may be fed back to a next exposure or a next alignment instead to simplify processes and reduce costs.

Refer to step S3 of FIG. 1: determining an exposure parameter corresponding to each exposure field and an exposure location on the target portion from the alignment data for the respective exposure field by a calculating system. An exposure parameter such as exposure amount, exposure angle or/and others and an exposure location of the exposure parameter on the target portion 51 of the substrate 100 are adjusted according to the alignment data. The exposure parameter caused by deformation, rotation, shifting of the substrate 100, exposure deviation under processing limitation or optical deviation of patterns such as rounding or shrinking occurring on edges of patterns thus can be corrected and compensated. Meanwhile, locations of patterns on the target portions 52 of the substrate 100 can be adjusted.

Refer to step S4 of FIG. 1: exposing the exposure parameter at the exposure location on the target portion by an exposure system, thereby a target pattern forming on the target portion. The exposure parameter is exposed at the exposure location of the target portion 51, thereby a target pattern being on the target portion 51. Meanwhile, the corresponding target patterns of the exposure fields 120 are also formed on the target portions 52.

Refer to step S5 of FIG. 1: measuring the overlapping of the target pattern on the target portion to obtain overlapping data, and analyzing the overlapping data. After exposure, the positions of the target patterns on the target portions 51/52, and the overlapping relation between the target patterns and the patterns previously formed on the target portions 51/52 can be measured to obtain overlapping data. The overlapping data is then analyzed by an operation system.

Refer to step S6 of FIG. 1: applying an advanced process control (APC) according to the overlapping data or/and the alignment data. An advanced process control (APC), which may include feeding back above overlapping data/above alignment data to a next substrate, a next exposure or/and a next measurement, is performed. In one case, the overlapping data and the alignment data may be fed back with different weightings according to processing requirements, tolerances, etc. Moreover, the advanced process control (APC) process may include feeding back the overlapping data or/and the alignment data to common positions of exposure fields of the next substrate, or to different exposure steps of the same substrate.

Above all, by applying the method of the present invention, a set of alignment marks having a plurality of alignment marks in each exposure field can be measured, wherein the alignment marks are preferably distributed uniformly in each exposure field for fully measuring all parts of each exposure field, thereby alignment data being obtained; an exposure parameter and an exposure location of the exposure parameter can be adjusted according to the alignment data; a target pattern can be formed in each exposure field of a substrate by exposure. Furthermore, the alignment data may be fed back to a next substrate, a next exposure or a next alignment, etc. After exposure, the overlapping relation of the target pattern and the substrate (the previous formed pattern on the substrate) may be measured to obtain overlapping data, and then the overlapping data can be analyzed. Thereafter, an advanced process control (APC) may be processed to feed back the alignment data or the overlapping data to later processes.

Figure 3:
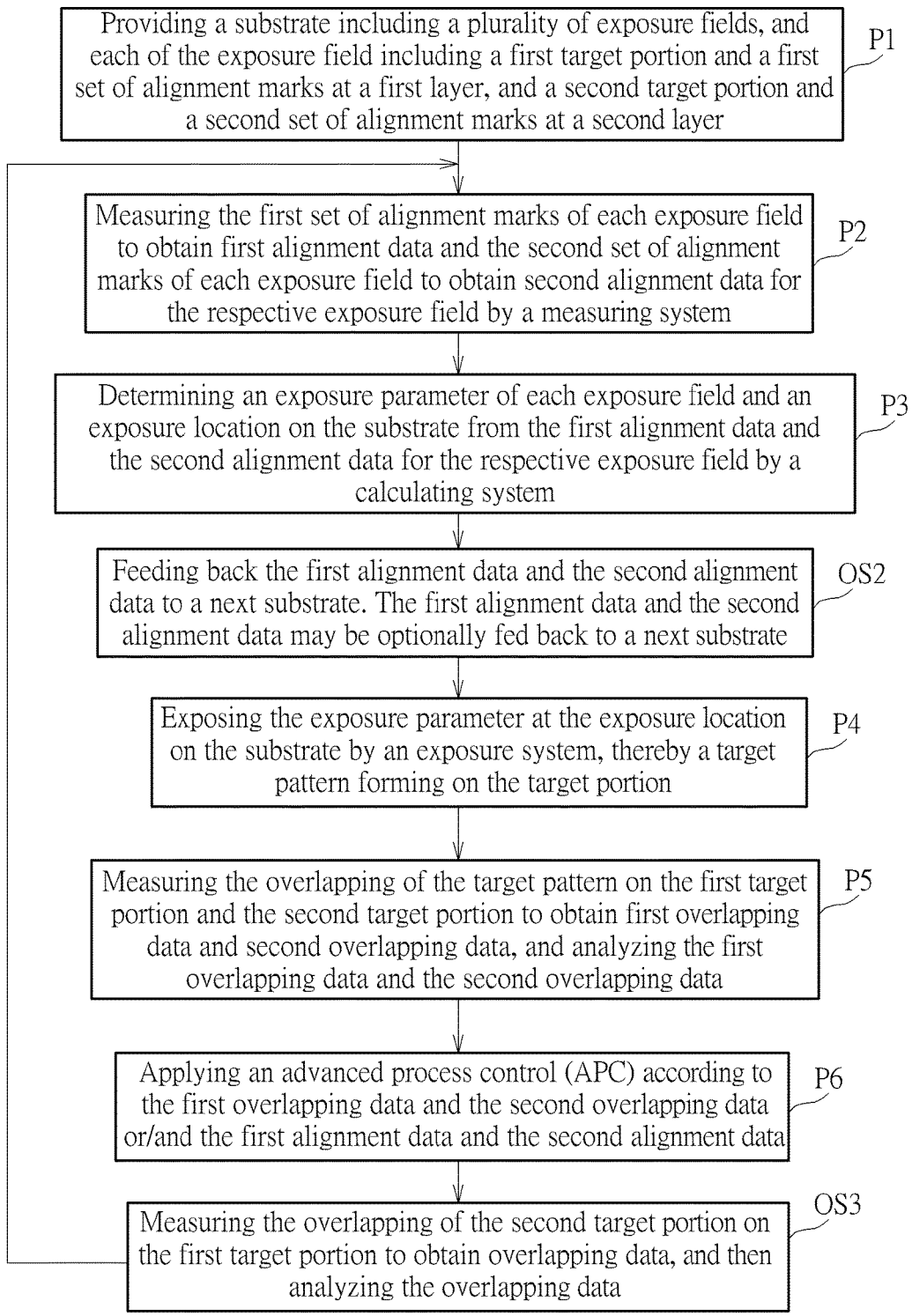
FIG. 3 schematically depicts a flow chart of a method of forming an integrated circuit according to another embodiment of the present invention.
Figure 4:
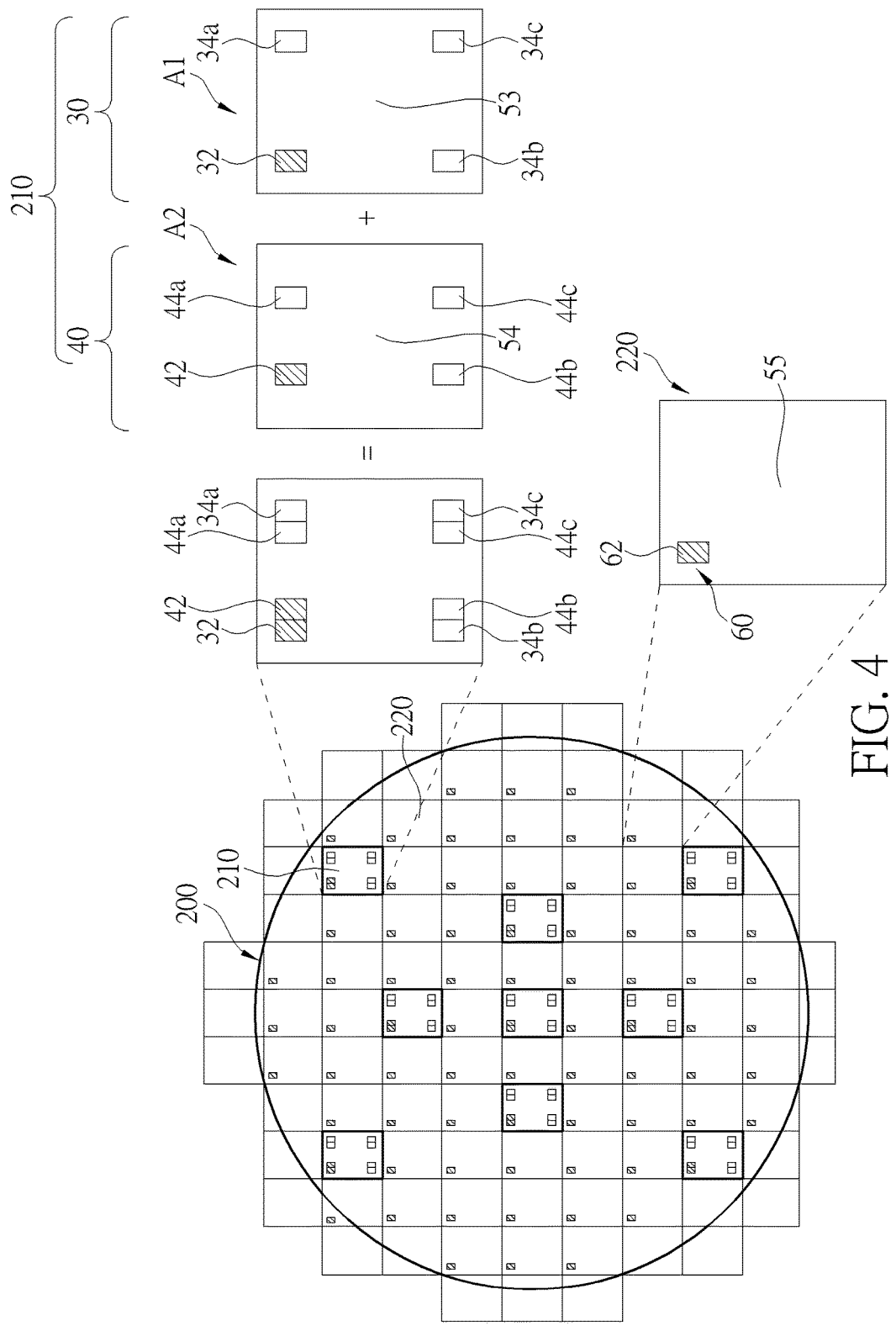
FIG. 4 schematically depicts a top view of sets of alignment marks on each exposure field of a substrate according to another embodiment of the present invention.

The measuring method of the present invention may be applied to form an integrated circuit with multilayers. FIG. 3 schematically depicts a flow chart of a method of forming an integrated circuit according to another embodiment of the present invention. FIG. 4 schematically depicts a top view of sets of alignment marks on each exposure field of a substrate according to another embodiment of the present invention.

Figure 5:
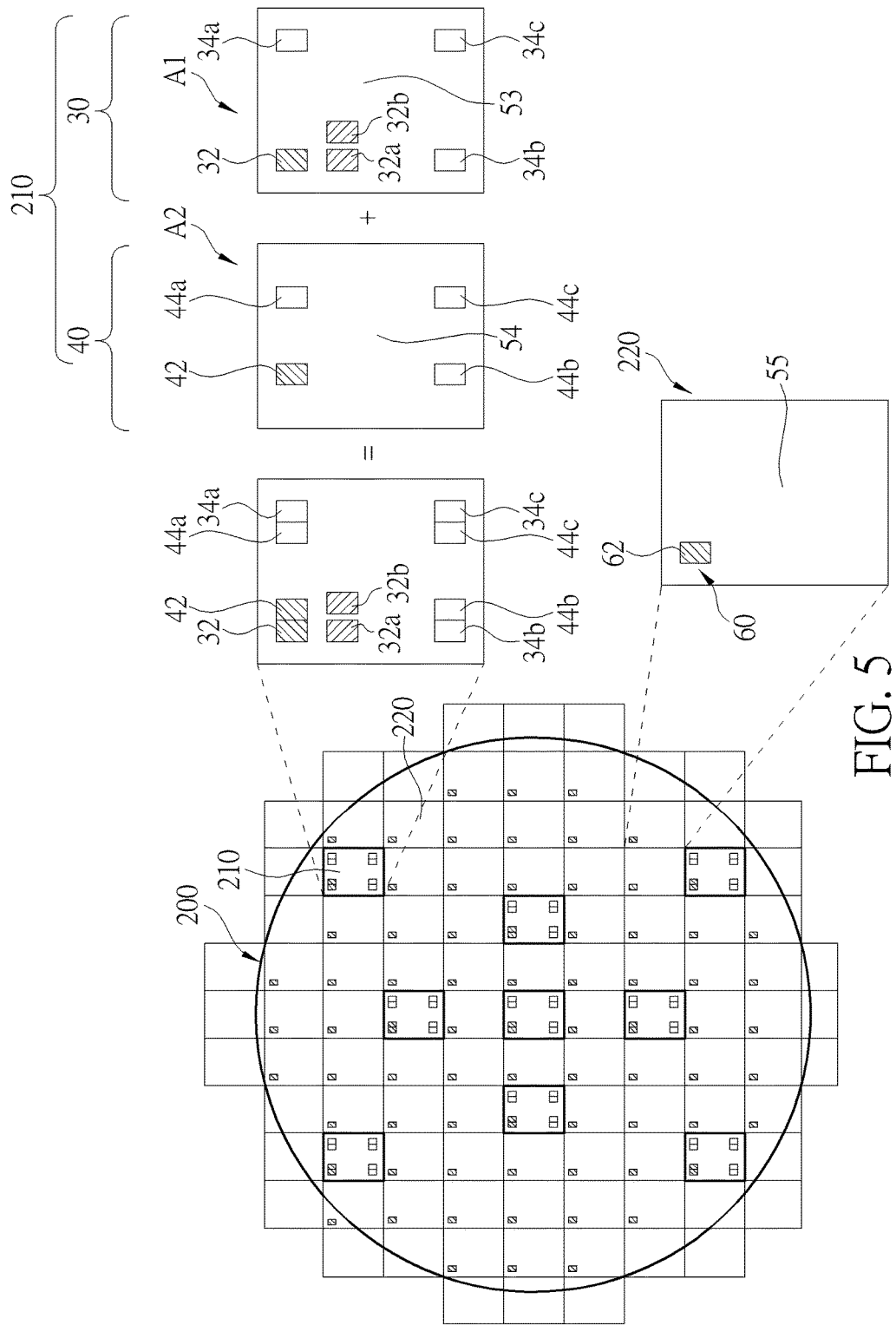
FIG. 5 schematically depicts a top view of sets of alignment marks on each exposure field of a substrate according to another embodiment of the present invention.

Refer to step P1 of FIG. 3: providing a substrate including a plurality of exposure fields, and each of the exposure field including a first target portion and a first set of alignment marks at a first layer, and a second target portion and a second set of alignment marks at a second layer. As shown in FIG. 4, a substrate 200 may include a plurality of exposure fields 210/220, wherein the exposure fields 210 and the exposure fields 220 may have different numbers of alignment marks. In this embodiment, each of the exposure fields 210 may include a first set of alignment marks 30 and a first target portion 53 in a first layer A1, wherein the first set of alignment marks 30 may have a main alignment mark 32 and three additional alignment marks 34a/34b/34c respectively located in four corners of the exposure field 210; each of the exposure fields 210 may further include a second set of alignment marks 40 and a second target portion 54 in a second layer A2, wherein the second set of alignment marks 40 may have a main alignment mark 42 and three additional alignment marks 44a/44b/44c respectively located in four corners of the exposure field 210. The first set of alignment marks 30 and the second set of alignment marks 40 may have different numbers of the main alignment marks and the additional alignment marks. For example, the first set of alignment marks 30 only has one main alignment mark 32 in this case, but first set of alignment marks 30 may have three main alignment marks 32/32a/32b alternatively, as shown in FIG. 5, but it is not limited thereto. In this case, the first layer A1 and the second layer A2 are different layers aligned to each other, but it is not limited thereto. In other cases, the first layer A1 and the second layer A2 may be one same layer. Moreover, each of the exposure fields 220 may include a set of alignment marks 60 and a target portion 55, wherein the set of alignment marks 60 may only have a main alignment mark 62, but it is not limited thereto. The set of alignment marks 60 and the target portions 55 in the exposure fields 220 may be in the same layer as the first layer A1, or the same layer as the second layer A2 instead.

In other cases, the numbers and distributions of the first set of alignment marks 30 and the second set of alignment marks 40 in the exposure fields 210, and the numbers and distribution of the set of alignment marks 60 in the exposure fields 220 may be different. In this embodiment, deformations, rotations, shiftings or so on of each of the exposure fields 210 can be obtained by the alignment positions of the main alignment mark 32 and the additional alignment marks 34a/34b/34c and relative relations of the main alignment mark 32 and the additional alignment marks 34a/34b/34c such as relative positions, relative distances, relative angles or so on of the main alignment mark 32 and the additional alignment marks 34a/34b/34c. Likewise, the main alignment mark 42 and the additional alignment marks 44a/44b/44c are also in the exposure fields 210 of the substrate 200, and thereby deformations, rotations, shiftings or so on of each of the exposure fields 210 can be obtained by the alignment positions of the main alignment mark 42 and the additional alignment marks 44a/44b/44c and relative relations of the main alignment mark 42 and the additional alignment marks 44a/44b/44c such as relative positions, relative distances, relative angles or so on of the main alignment mark 42 and the additional alignment marks 44a/44b/44c. In this case, the additional alignment marks 34a/34b/34c/44a/44b/44c are only in the exposure fields 210 of the substrate 200, thus only the exposure fields 210 at specific/selected positions being analyzed with multi-points. Hence, this reduces operation time and increases processing efficiency. In a preferred embodiment, the exposure fields 210 are distributed symmetric from a center point, but it is not limited thereto.

Refer to step P2 of FIG. 3: measuring the first set of alignment marks of each exposure field to obtain first alignment data and the second set of alignment marks of each exposure field to obtain second alignment data for the respective exposure field by a measuring system. The first set of alignment marks 30 of each exposure field 210 is measured to obtain first alignment data, the second set of alignment marks 40 of each exposure field 210 is measured to obtain second alignment data, and the set of alignment marks 60 is measured to obtain a third alignment data. The first alignment data, the second alignment data and the third alignment data reveal point alignments of the substrate 200 from the absolute positions of the first set of alignment marks 30, the second set of alignment marks 40 and the set of alignment marks 60 in each exposure field 210/220. It is emphasized that, deformations, rotations and shiftings or so on of each exposure field 210 can be obtained by relative parameters of the first set of alignment marks 30 and relative parameters of the second set of alignment marks 40, such as relative positions, relative distances, relative angles so on of the main alignment mark 32 and the additional alignment marks 34a/34b/34c in each of the exposure fields 210; likewise, relative positions, relative distances, relative angles so on of the main alignment mark 42 and the additional alignment marks 44a/44b/44c in each of the exposure fields 210. In this way, by applying the measuring method of the present invention, not only point alignments but also deformations, rotations and shiftings so on of each of the exposure fields 210 of the substrate 200 can be obtained immediately. Therefore, exposure parameters can be adjusted according to alignment data to make integrated circuit forming processes more precise, with low cost and quick. In other words, the first layer A1 and the second layer A2 are measured individually to get alignment data respectively in this embodiment, but it is not limited thereto. In other embodiments, the first layer A1 and the second layer A2 may be seen as one same layer and be measured to get single alignment data.

Refer to step P3 of FIG. 3: determining an exposure parameter of each exposure field and an exposure location on the substrate from the first alignment data and the second alignment data for the respective exposure field by a calculating system. An exposure parameter such as exposure amount, exposure angle or/and so on and an exposure location of the exposure parameter on the substrate 200 are adjusted according to the first alignment data and the second alignment data. The exposure parameter caused by deformation, rotation, shifting of the substrate 200 and exposure deviation under processing limitation or optical deviation of patterns such as rounding or shrinking occurring on edges of patterns thus can be corrected and compensated. In this case, the exposure parameter and the exposure location of each exposure field are determined according to the first alignment data and the second alignment with different weightings because of relative alignment critical requirements or relative alignment tolerances of the first alignment data and the second alignment. Meanwhile, corresponding patterns on the target portions 55 of the substrate 220 may be adjusted according the third alignment data.

Refer to step OS2 of FIG. 3: feeding back the first alignment data and the second alignment data to a next substrate. The first alignment data and the second alignment data may be optionally fed back to a next substrate. Thereby, the next substrate or a set of common substrates can be exposed directly according to the first alignment data and the second alignment data after being positioned during photolithography. In addition, the first alignment data and the second alignment data may be reference data for the photolithography of the next substrate or a set of common substrates to make processes precise and with low cost. The step may be processed before the step P3 of FIG. 3: determining an exposure parameter of each exposure field and an exposure location on the substrate from the first alignment data and the second alignment data for the respective exposure field by a calculating system, or other (later) steps instead. The alignment data may be fed back to a next exposure or a next alignment instead to simplify processes and reduce costs.

Refer to step P4 of FIG. 3: exposing the exposure parameter at the exposure location on the substrate by an exposure system, thereby a target pattern forming on the target portion. The exposure parameter is exposed at the exposure location on the substrate 200, thereby a target pattern being on the substrate 200. Meanwhile, the target pattern may include corresponding patterns formed on the first target portion 53, the second target portion 54 and the target portion 55.

Refer to step P5 of FIG. 3: measuring the overlapping of the target pattern on the first target portion and the second target portion to obtain first overlapping data and second overlapping data, and analyzing the first overlapping data and the second overlapping data. After exposure, the position of the target pattern on the first target portion 53 and the second target portion 54, and the overlapping relation of the target pattern and the pattern previously formed on the first target portion 53, and the overlapping relation of the target pattern and the pattern previously formed on the second target portion 54 can be measured respectively to obtain first overlapping data and second overlapping data. The first overlapping data and the second overlapping data are then analyzed by an operation system. Meanwhile, the position of the target pattern formed on the target portion 55 and the overlapping of the target pattern and the pattern previously formed on the target portion 55 may also be measured to obtain third overlapping data. Then, the third overlapping data is analyzed by an operation system. In this case, the overlapping relation to the first layer A1 and the second layer A2 are measured individually, thereby correction and compensation to the first layer A1 and the second layer A2 may have different weightings, but it is not limited thereto. In other cases, the first layer A1 and the second layer A2 may be seen as one same layer, and thus only one overlapping data is obtained and analyzed.

Refer to step P6 of FIG. 3: applying an advanced process control (APC) according to the first overlapping data and the second overlapping data or/and the first alignment data and the second alignment data. An advanced process control (APC) process, which may include feeding back above first overlapping data and above second overlapping data/above first alignment data and the second alignment data to a next substrate, a next exposure or/and a next measurement, is performed. In one case, the above first overlapping data and above second overlapping data/above first alignment data and the second alignment data may be fed back with different weightings according to alignment requirements and tolerance so on to the first layer A1 and the second layer A2.

Furthermore, before exposure, meaning the step P4 of FIG. 3: exposing the exposure parameter at the exposure location on the substrate by an exposure system, thereby a target pattern being on the substrate; or, preferably before the step P2 of FIG. 3: measuring the first set of alignment marks of each exposure field to obtain first alignment data and the second set of alignment marks of each exposure field to obtain second alignment data for the respective exposure field by a measuring system, the overlapping of patterns previously on the first layer A1 and the second layer A2 may be measured. That is, the overlapping of the second target portion 54 and the first target portion 53 is measured to get overlapping data; then, the overlapping data is analyzed, Refer to step OS3 of FIG. 3: measuring the overlapping of the second target portion on the first target portion to obtain overlapping data, and then analyzing the overlapping data. Thus, exposure parameters can be determined according to the overlapping data as well as the first alignment data, the second alignment data and the third alignment data, meaning processing the step P3 of FIG. 3: determining an exposure parameter of each exposure field and an exposure location on the substrate from the overlapping data, the first alignment data, the second alignment data and the third alignment data for the respective exposure field by a calculating system. In one case, the first alignment data, the second alignment data and the overlapping data may be applied with different weightings according to alignment requirements and tolerances so on to the first layer A1 and the second layer A2.

Above all, the first alignment data and the second alignment data are obtained respectively by measuring the first set of alignment marks in the first layer A1 and the second set of alignment marks in the second layer A2 individually.

Hence, corrections and compensations to the first layer A1 and the second layer A2 can be carried out individually, by obtaining the exposure parameters and the exposure locations of the exposure parameters on the substrate respectively. Preferably, the first alignment data and second alignment data may be applied with different weightings according to alignment requirements and tolerances so on to the first layer A1 and the second layer A2.

Moreover, after exposure, the overlapping of the target patterns on different layers may be measured individually to obtain the first overlapping data and the second overlapping data respectively, and then the first overlapping data and the second overlapping data are analyzed. An advanced process control (APC) process may thus be processed according to the first overlapping data and the second overlapping data with different weightings due to alignment requirements and tolerances so on to the first layer A1 and the second layer A2.

To summarize, the present invention provides a method of forming an integrated circuit, which includes: measuring a set of alignment marks of each exposure field to obtain alignment data for the respective exposure field by a measuring system; determining an exposure parameter and an exposure location corresponding to each exposure field from the alignment data for the respective exposure field by a calculating system; and forming a target pattern on each exposure field of a substrate by exposure. After exposure, the overlapping relation of the target pattern and the pattern previously formed on the substrate may be measured to obtain overlapping data, and the overlapping data can be analyzed. Thereafter, an advanced process control (APC) may be carried out to feed back the alignment data or the overlapping data to later processes. This is a measuring way for a target pattern on one single layer. The present invention also provides a measuring way for a target pattern on multilayers, which includes: measuring a first set of alignment marks of each exposure field to obtain first alignment data and the second set of alignment marks of each exposure field to obtain second alignment data for the respective exposure field by a measuring system; determining an exposure parameter of each exposure field and an exposure location on the substrate from the first alignment data and the second alignment data for the respective exposure field by a calculating system; forming a target pattern on each exposure field of a substrate by exposure. After exposure, the overlapping relation of the target pattern corresponding to a first target portion in a first layer and the overlapping relation of the target pattern corresponding to a second target portion in a second layer may be measured individually to obtain first overlapping data and second overlapping data, and the first overlapping data and the second overlapping data can be analyzed. Thereafter, an advanced process control (APC) may be carried out according to the first alignment data and the second alignment data or/and the first overlapping data and the second overlapping data in later processes.

Moreover, the alignment data, the first alignment data and the second alignment data may be fed back to a next substrate, a next exposure or/and a next alignment. The alignment data, the first alignment data and the second alignment data, the overlapping data, the first overlapping data and the second overlapping data can be utilized to process an advanced process control (APC) to feed back to a next substrate, a next exposure or/and a next alignment. The exposure parameter can be determined according to the first alignment data and second alignment data with different weightings according to alignment requirements, tolerances, and so on. Or, the advanced process control (APC) may be carried out according to the first overlapping data and the second overlapping data with different weightings. Before the first alignment data and second alignment data are measured, the overlapping of a first target portion in the first layer and a second target portion in the second layer may be measured to obtain overlapping data and then the overlapping data is analyzed. Thereby, the overlapping data as well as the first alignment data and second alignment data can be utilized to determine the exposure parameter, or feed back to a next substrate, a next exposure or/and a next alignment. Preferably, the overlapping data, the first alignment data and the second alignment data may have different weightings according to alignment requirements, tolerances, and so on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an integrated circuit, comprising:
providing a substrate comprising a plurality of exposure fields, and each of the exposure fields comprises a target portion and a set of alignment marks;
measuring the set of alignment marks of each exposure field to obtain alignment data for the respective exposure field by a measuring system;
determining an exposure parameter corresponding to each exposure field and an exposure location on the target portion from the alignment data for the respective exposure field by a calculating system, wherein the measuring of the set of alignment marks of each exposure field for obtaining alignment data and the determining of the exposure parameter and the exposure location on the target portion from the alignment data are performed before the step of exposing at the exposure location on the target portion and forming a target pattern on the target portion; and
feeding back the alignment data to a next substrate.

2. The method of forming an integrated circuit according to claim 1, wherein the step of feeding back the alignment data to the next substrate comprises:
determining an exposure parameter corresponding to each exposure field of the next substrate and an exposure location on the exposure field of the next substrate from the alignment data for the respective exposure field by a calculating system.

3. The method of forming an integrated circuit according to claim 1, wherein the step of feeding back the alignment data to the next substrate comprises:
re-calculating the alignment data and an alignment data of the next substrate to process an exposure to the next substrate.

4. The method of forming an integrated circuit according to claim 3, wherein the alignment data and the alignment data of the next substrate are utilized with different weightings.

5. The method of forming an integrated circuit according to claim 1, further comprising:
measuring the overlapping of the target pattern and the target portion to obtain overlapping data after the target pattern forming on the target portion; and
analyzing the overlapping data.

6. The method of forming an integrated circuit according to claim 5, further comprising:

applying an advanced process control (APC) according to the overlapping data or/and the alignment data to feed back to the next substrate after the overlapping data is obtained.

7. The method of forming an integrated circuit according to claim 6, wherein the advanced process control (APC) comprises feeding back the overlapping data and the alignment data with different weightings.

8. A method of forming an integrated circuit, comprising:
providing a substrate comprising a plurality of exposure fields, and each of the exposure field comprising a first target portion and a first set of alignment marks at a first layer, and a second target portion and a second set of alignment marks at a second layer;
measuring the first set of alignment marks of each exposure field to obtain first alignment data and the second set of alignment marks of each exposure field to obtain second alignment data for the respective exposure field by a measuring system; and
determining an exposure parameter of each exposure field and an exposure location on the substrate from the first alignment data and the second alignment data for the respective exposure field by a calculating system, wherein the measuring of the first set of alignment marks of each exposure field for obtaining first alignment data, the measuring of the second set of alignment marks of each exposure field for obtaining second alignment data, and the determining of the exposure parameter and the exposure location on the substrate from the first and the second alignment data are performed before the step of exposing at the exposure location on the substrate and forming a target pattern on the substrate.

9. The method of forming an integrated circuit according to claim 8, further comprising:
feeding back the first alignment data and the second alignment data to a next substrate after the exposure parameter and the exposure location on the substrate are determined.

10. The method of forming an integrated circuit according to claim 8, wherein the exposure parameter and the exposure location on the substrate are determined according to the first alignment data and the second alignment data with different weightings.

11. The method of forming an integrated circuit according to claim 8, wherein the first layer and the second layer are different layers.

12. The method of forming an integrated circuit according to claim 11, wherein the first set of alignment marks on the first layer has at least two alignment marks, and the second set of alignment marks on the second layer has at least two alignment marks.

13. The method of forming an integrated circuit according to claim 8, further comprising:
measuring the overlapping of the target pattern on the first target portion and on the second target portion respectively after the target pattern forming on the substrate to obtain first overlapping data and second overlapping data; and
analyzing the first overlapping data and the second overlapping data.

14. The method of forming an integrated circuit according to claim 13, further comprising:
applying an advanced process control (APC) according to the first overlapping data and the second overlapping data or/and the first alignment data and the second alignment data after the first overlapping data and the second overlapping data are obtained, to feed back to a next substrate.

15. The method of forming an integrated circuit according to claim 14, wherein the advanced process control is applied by using the first overlapping data and the second overlapping data with different weightings.

16. The method of forming an integrated circuit according to claim 8, further comprising:
measuring the overlapping of the second target portion on the first target portion to obtain overlapping data before measuring the first set of alignment marks of each exposure field to obtain the first alignment data and the second set of alignment marks of each exposure field to obtain the second alignment data; and
analyzing the overlapping data.

17. The method of forming an integrated circuit according to claim 16, wherein the exposure parameter is determined by the first alignment data, the second alignment data and the overlapping data.

18. The method of forming an integrated circuit according to claim 17, wherein the exposure parameter is determined by the first alignment data, the second alignment data and the overlapping data with different weightings.

19. The method of forming an integrated circuit according to claim 1, wherein the set of alignment marks comprises a main alignment mark and additional alignment marks, and the main alignment mark and the additional alignment marks are not organized by any radial symmetrical center point.

20. The method of forming an integrated circuit according to claim 19, wherein the deformation, rotation, and shifting of each exposure field is obtained by alignment positions of the main alignment mark and the additional alignment marks and relative relations of the main alignment mark and the additional alignment marks in multiple layers.

* * * * *